(12) United States Patent
Mallikarjunaswamy et al.

(10) Patent No.: US 12,087,759 B2
(45) Date of Patent: Sep. 10, 2024

(54) LOW CAPACITANCE TWO CHANNEL AND MULTI-CHANNEL TVS WITH EFFECTIVE INTER-CONNECTION

(71) Applicant: Alpha and Omega Semiconductor International LP, Toronto (CA)

(72) Inventors: Shekar Mallikarjunaswamy, San Jose, CA (US); Juan Luo, San Jose, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 310 days.

(21) Appl. No.: 17/364,022

(22) Filed: Jun. 30, 2021

(65) Prior Publication Data

US 2023/0005906 A1 Jan. 5, 2023

(51) Int. Cl.
*H01L 27/02* (2006.01)

(52) U.S. Cl.
CPC ...... *H01L 27/0248* (2013.01); *H01L 27/0255* (2013.01); *H01L 27/0262* (2013.01); *H01L 27/0292* (2013.01); *H01L 27/0296* (2013.01)

(58) Field of Classification Search
CPC ............. H01L 27/0248; H01L 27/0255; H01L 27/0262; H01L 27/0292; H01L 27/0296
See application file for complete search history.

(56) References Cited

U.S. PATENT DOCUMENTS

| | | | |
|---|---|---|---|
| 7,538,997 B2 | 5/2009 | Mallikararjunaswamy | |
| 7,554,839 B2 | 6/2009 | Bobde | |
| 7,781,826 B2 | 8/2010 | Mallikararjunaswamy et al. | |
| 7,795,987 B2 | 9/2010 | Bobde | |
| 7,863,995 B2 | 1/2011 | Ho et al. | |
| 7,880,223 B2 | 2/2011 | Bobde | |
| 8,218,276 B2 | 7/2012 | Mallikarjunaswamy | |
| 8,338,854 B2 | 12/2012 | Bobde et al. | |
| 8,698,196 B2 | 4/2014 | Guan et al. | |
| 9,230,953 B2 | 1/2016 | Pan et al. | |
| 9,627,372 B2 | 4/2017 | Lai | |
| 10,141,300 B1 | 11/2018 | Mallikarjunaswamy | |
| 10,373,947 B2 | 8/2019 | Mallikarjunaswamy et al. | |
| 10,825,805 B2 | 11/2020 | Mallikarjunaswamy | |
| 2007/0008667 A1 | 1/2007 | Steinhoff | |

(Continued)

FOREIGN PATENT DOCUMENTS

| | | |
|---|---|---|
| CN | 107919355 A | 4/2018 |
| CN | 108565260 A | 9/2018 |

(Continued)

*Primary Examiner* — Tucker J Wright
(74) *Attorney, Agent, or Firm* — JDI PATENT; Joshua D. Isenberg; Robert Pullman

(57) ABSTRACT

A transient voltage suppressing device includes a plurality of fingers arranged laterally along a major surface of an epitaxial layer. The plurality of fingers includes fingers of a first type and fingers of a second type. The first type and second type of fingers each include a silicon controlled rectifier (SCR) region and a junction diode region. The plurality of fingers of the second type are conductively coupled together by a second metal layer disposed over top a first metal layer and electrically insulated from the first metal layer. The first metal layer conductively couples the SCR region and junction diode region of the first type of finger.

19 Claims, 8 Drawing Sheets

(56) References Cited

U.S. PATENT DOCUMENTS

| | | |
|---|---|---|
| 2009/0040670 A1 | 2/2009 | Camp et al. |
| 2009/0045436 A1 | 2/2009 | Verleye et al. |
| 2009/0237847 A1 | 9/2009 | Ryu et al. |
| 2013/0229223 A1 | 9/2013 | Shrivastava et al. |
| 2014/0126095 A1* | 5/2014 | Venkatasubramanian .................... H01L 27/0251 361/56 |
| 2016/0104700 A1 | 4/2016 | Notermans et al. |
| 2017/0012036 A1 | 1/2017 | Quax et al. |
| 2017/0092760 A1 | 3/2017 | Parris et al. |
| 2017/0117267 A1 | 4/2017 | Raad et al. |
| 2018/0247892 A1* | 8/2018 | Ikegaya .............. H01L 23/5226 |

FOREIGN PATENT DOCUMENTS

| | | |
|---|---|---|
| TW | 201902066 A | 1/2019 |
| TW | 201924174 A | 6/2019 |
| TW | 202017143 A | 5/2020 |

* cited by examiner

LOW CAPACITANCE TWO CHANNEL AND MULTI-CHANNEL TVS WITH EFFECTIVE INTER-CONNECTION

FIELD OF THE INVENTION

Embodiments of the present invention are related to semiconductor devices, specifically aspects of the present disclosure are related to transient voltage suppression devices.

BACKGROUND OF THE INVENTION

Electronic device components are very susceptible to transient voltage spikes (transients). A transient voltage spike is a brief increase in voltage through the device. The spike in voltage can range from a few millivolts to thousands of volts. These events may be caused by noise in the power supply such as from inductive ringing from an electric motor or poorly designed power converters, bad connections or wiring causing arcing, or by natural electric events such as electrostatic discharge. These transient events can damage sensitive device components such as capacitors and resistors causing failure or improper device functionality.

To protect against transients various components have been used to shunt the voltage spikes away from the sensitive parts of devices. Components used to protect against transients include decoupling capacitors, Zener diodes, avalanche diodes, metal oxide varistors, poly switches and transient voltage suppressor diodes.

Transient voltage suppressor diodes (TVS) offer many benefits over the other components used to protect against transients. Particularly, transient voltage suppressor diodes are fast acting, good for moderate frequency applications, can be both uni-direction and bidirectional, have a low clamping voltage and fail safely into a closed circuit.

Past designs for transient voltage suppressor diodes had high capacitances and large device packages owing to non-optimal interconnections between portions of the transient voltage suppressor diodes. Thus, aspects of the present disclosure have been developed to address these needs.

BRIEF DESCRIPTION OF THE DRAWINGS

The teachings of the present disclosure can be readily understood by considering the following detailed description in conjunction with the accompanying drawings, in which.

DESCRIPTION OF THE SPECIFIC EMBODIMENTS

Figure 1A:
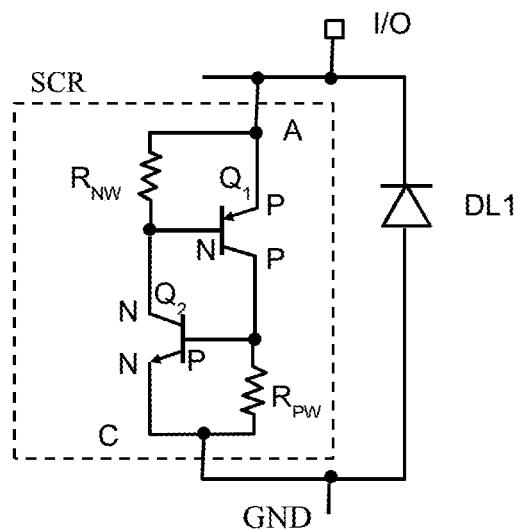
FIG. 1A is an equivalent circuit diagram of a TVS protection device according to aspects of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the interest of clarity, not all of the routine features of the implementations described herein are shown and described. It will be understood by those skilled in the art that in the development of any such implementations, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of the present disclosure.

The disclosure herein refers silicon doped with ions of a first conductivity type or a second conductivity. The ions of the first conductivity type may be opposite ions of a second conductivity type. For example, ions of the first conductivity type may be n-type, which create charge carriers when doped into silicon. Ions of the first conductivity type include phosphorus, antimony, bismuth, lithium and arsenic. Ions of the second conductivity may be p-type, which create holes for charge carriers when doped into silicon and in this way are referred to as being the opposite of n-type. P-type type ions include boron, aluminum, gallium and indium. While the above description referred to n-type as the first conductivity type and p-type as the second conductivity the disclosure is not so limited, p-type may be the first conductivity and n-type may be second the conductivity type.

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general, terms, an n+ material has a higher n type net dopant (e.g., electron) concentration than an n material, and an n− material has a higher carrier concentration than an n− material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

Operation of a TVS device depicted may be appreciated by referring to the equivalent circuit diagram shown in FIG. 1A. The TVS device includes a P-N junction diode DL1 connected in a forward direction between a protected node (I/O terminal) and ground potential. That is, the anode of the diode DL1 is connected to the ground node and the cathode of the diode DL1 is connected to the protected node. Diode DL1 functions as the low-side steering diode of the TVS protection device. The TVS device includes the SCR device connected in parallel with the P-N junction diode DL1. In particular, the SCR device can be represented as two back-to-back connected PNP and NPN bipolar transistors. The anode of the SCR device is the P-type emitter of the PNP bipolar transistor which is also connected to the N-type base through the base resistance RNW. The cathode of the SCR device is the N-type emitter of the NPN bipolar transistor which is connected to ground potential and to the N-type base of the NPN bipolar transistor through the base resistance RPW. As thus configured, contributions to the parasitic capacitance of the TVS device at the protected node (I/O terminal) are mainly from the N-type region of the P-N junction diode DL1 and the anode of the SCR device.

According to aspects of the present disclosure, a transient voltage suppressing device may include a semiconductor epitaxial layer on a surface of a semiconductor substrate having a light concentration of ions of a first conductivity type that is opposite a second conductivity type. A plurality of semiconductor fingers may be arranged laterally along a major surface of the epitaxial layer. The semiconductor fingers may include first type fingers and second type fingers. The first and second types of fingers may include a silicon controlled rectifier (SCR) portion and a junction diode portion.

The first type of finger includes a first metal layer that conductively couples the SCR portion to the junction diode portion wherein the first metal couples the plurality of fingers of the first type together. The plurality of fingers of the second type are coupled together by a second metal layer that is electrically insulated from the first metal layer and over top first metal layer. A junction diode is formed between the junction diode portion of the first type of finger and the junction portion of the second type of finger. An SCR is formed between the SCR portion of the first type of finger and the SCR portion of the second type of finger. The SCR portion of the first type of finger and the SCR portion of the second type of finger may be located proximal to each other in the epitaxial layer. Additionally, the junction diode portion of the first type of finger and the junction diode portion of the second type of finger maybe located proximal to each other in the epitaxial layer.

The first type of finger may include an SCR cathode region that acts as the cathode for the SCR formed between the SCR portion of the first type of finger and the SCR portion of the second type of finger and wherein the second type of finger may include an SCR anode region that acts as an anode for said SCR. In a bi-directional device, the first type of fingers may be electrically coupled to a reference node and the second type of fingers may be electrically coupled to a protected node. In a uni-directional device, the first metal layer may be conductively coupled to a ground plane. The fingers of the first type may include a first well region lightly doped with the first conductivity type formed in the epitaxial layer, wherein the SCR portion for fingers of the first type may further include a SCR collector region heavily doped with ions of the second conductivity type in the first well region and a first SCR well contact region. The fingers of the second type may include a second well region lightly doped with the second conductivity type formed in the epitaxial layer, wherein the SCR portion for fingers of the second type may further include an SCR emitter region heavily doped with ions of the first conductivity type in the second well region and a second SCR well contact region. The junction diode portion of the first type of finger may include a junction anode region heavily doped with ions of the first conductivity type. The junction diode region of the second type of finger may include a junction diode cathode region heavily doped with ions of the second conductivity type. The TVS device may further include an insulating layer that insulates the first metal from the epitaxial layer and the second metal and wherein vias through the insulating layer electrically couple the first metal to the corresponding SRC region and the junction diode regions and the second metal to the corresponding SCR region and the junction diode region.

The SCR portion of the fingers of the first type may include an SCR collector region heavily doped with ions of the second conductivity type and an first SCR well contact region formed in a first well region of the epitaxial layer doped with ions of the first conductivity type. The SCR portion of fingers of the second type may include an SCR emitter region heavily doped with ions of the first conductivity type formed in a second well region of the epitaxial layer doped with ions of the second conductivity type. The SCR portion of the first type of finger and the SCR portion of the second type of finger are located proximal to the each other in the epitaxial layer.

An Input/Output (I/O) contact pad may be coupled to the top side of the second metal layer, wherein the first metal layer is underneath the second metal layer. The I/O contact pad may be a wire bonded to the topside of the second metal layer. The second metal layer may be thicker than the first metal layer.

The second metal layer for each of the fingers of the second type may be interrupted over the first metal layer. The interrupted second metal layer of each of the fingers of the second type may include a contact pad. The contact pad of each for each of the fingers of the second type may be conductively coupled to form a single channel. This so-called "pad-on-top" configuration allows freedom to engineer the finger geometry and allow the first metal layer to extend all the way across a die. This allows for longer fingers, which can carry higher current and reduce voltage. By way of contrast, a conventional configuration uses a bus on top to connect the grounds. In such a configuration fingers get smaller and finger length is limited. Parasitic capacitance therefore adds up due to the bus.

Figure 1B:
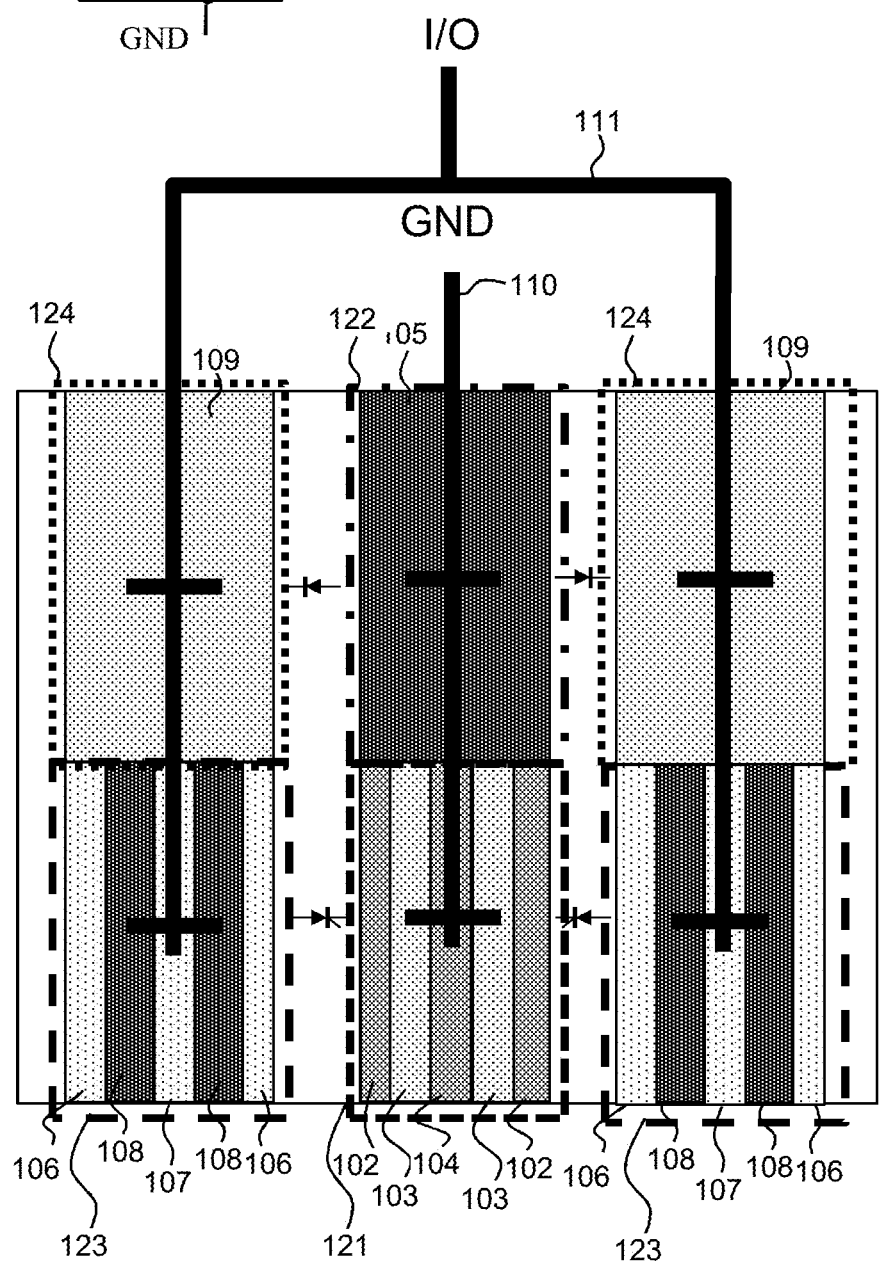
FIG. 1B is a top view depicting a pair of fingers in a single channel of the improved TVS including two types of overlapping fingers arranged laterally along a major surface of an epitaxial layer according to aspects of the present disclosure.

FIG. 1B is a top view depicting a pair of fingers in a single channel of the improved TVS including two types of overlapping fingers arranged laterally along a first direction on a major surface of an epitaxial layer 101 according to aspects of the present disclosure. The epitaxial layer 101 may be lightly doped with ions of a first conductivity type for example and without limitation, the epitaxial layer may be doped with p-type ions. A first type of finger may include a Silicon controlled rectifier (SCR) portion 121 and a junction diode portion 122. The SCR portion 121 may include a collector and well contact of an SCR formed in the epitaxial layer between the SCR portions of the first and second fingers. The SCR portion of the first finger 121 may include a first well region 102 doped with ions of the first conductivity type. An SCR collector region 103 heavily doped with ions of the second conductivity type may be formed in the well region, the SCR collector and a portion of the first well region may act as a first SCR well contact 104. The SCR collector region 102 and the first well contact region 104 may act as the SCR cathode region. For example the SCR collector region may be heavily doped with N type ions 103 next to a first SCR well contact region 104 heavily doped with P type ions 104 in the well region 102 that is more heavily doped with P-type ions than the epitaxial layer. The doping concentration of the first SCR well contact region 104 may be the same as the well region. The junction diode portion 122 of the first type of finger may include a junction anode region 105 formed in the epitaxial layer 101 and heavily doped with ions of the first conductivity type. The SCR collector region 103, the first SCR well contact region 104 and the junction diode anode region 105 may be conductively coupled by a connection 110, which may include for example and without limitation, conductive vias and a first metal layer. As shown, another connection 110 may also conductively couple the first finger may to ground for a uni-directional device. In some implementations, multiple channels may be connected together with a floating conductor creating a bi-directional device.

The second finger type may include and SCR portion 123 and a junction diode portion 124. The SCR portion 123 of the second finger type may include a well region 106 in the epitaxial layer doped with ions of the second conductivity type. The SCR portion 123 of the second finger may also include a heavily doped regions of the first conductivity type formed in the well region that is the SCR emitter region 108. The SCR emitter region and the SCR well contact region 107 that act as an anode for the SCR formed in the epitaxial layer. For example and without limitation, the SCR emitter region 108 may be heavily doped with P type ions next to a second SCR well contact region 107 heavily doped with N type ions in the N-type well region 106. The doping concentration of the second SCR well contact region 107 may be the same as the well region 106 and the second SCR well contact region may simply be a portion of the well region. This SCR portion 123 may form the anode for the SCR created in the epitaxial between the SCR regions of the first and second types of fingers. As shown, the SCR region 123 of the second finger type is located proximal to the SCR region of the first type of finger 121 this allows for a reduced capacitance and easier tuning. Note that in the implementation shown, the second well region 106 includes two SCR emitter regions 108 and the first well region 102 includes two SCR collector regions 103 to allow striping laterally along the major access of the epitaxial layer and reduce wasted space. The junction diode portion for the finger of the second type 124 is located on a side of the SCR portion 123 perpendicular to the side of the SCR portion 123 proximal to fingers of the first type 121, 122 and proximal to the junction diode portion for the finger of the first type 122. The junction diode portion 124 for the finger of the second type may include a Junction cathode region 109 formed in the epitaxial layer, heavily doped with ions of the second conductivity type. The junction diode portion 124 and the SCR portion 123 of each of the fingers of the second type may be conductively coupled 111 over the conductive coupling for the first type of finger 110 and the conductive coupling for the second type of finger 111 may be electrically isolated from the conductive coupling of the first type of finger 110. As shown the second type of finger may also be conductively coupled to an I/O or active portion of the device to be protected. During normal operation the TVS device acts in blocking mode preventing current from traveling to the ground connection but when a transient voltage spike occurs at the I/O the device may regulate to allow current flow ground shunting the transient away from the device to be protected.

Figure 2A:
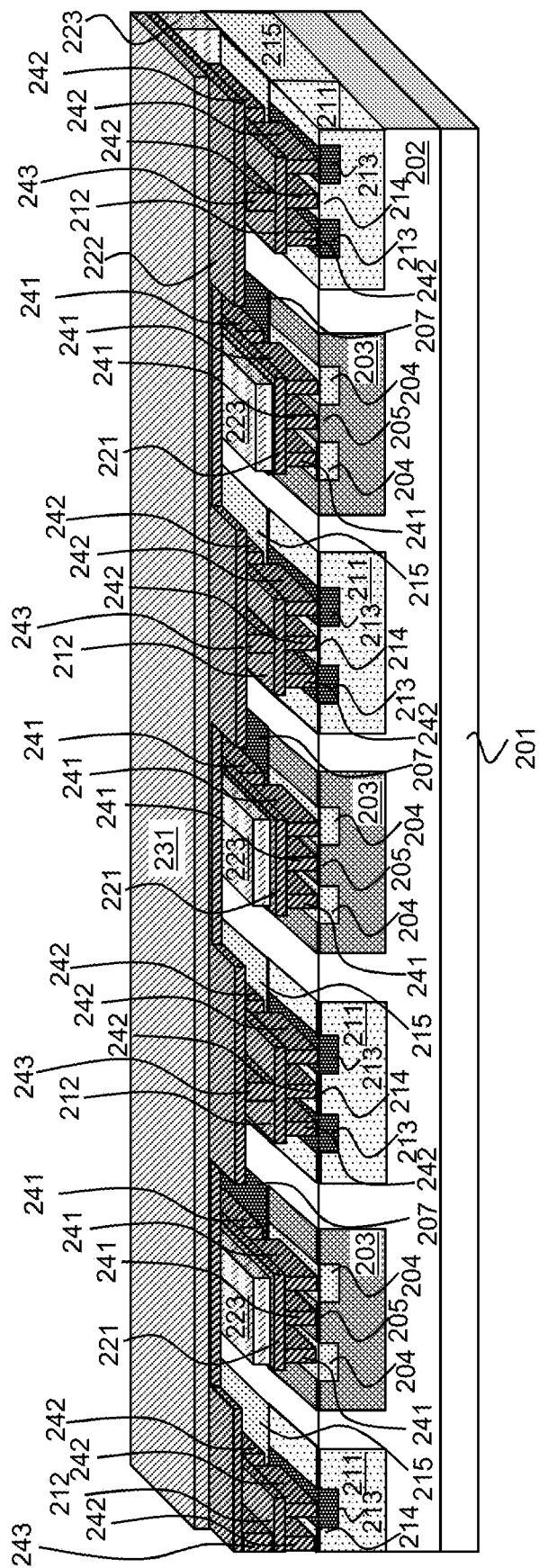
FIG. 2A shows a cut-away three-dimensional perspective view of an improved a single channel of the TVS device according to aspects of the present disclosure.

FIG. 2A shows a three-dimensional perspective view of an improved a single channel of the TVS device according to aspects of the present disclosure. The epitaxial layer 202 is disposed upon a major surface of a substrate that is lightly doped with ions of the first conductivity type. The epitaxial layer is lightly doped with ions of the first conductivity type at a concentration relatively greater than the substrate 201. As shown, the first type of finger includes SCR portions (regions 203, 205, 206) and junction diode anode regions (regions 207) that form lateral stripes in a major surface of the epitaxial layer. Portions of the first metal 221 run parallel to the lateral strips and couple the SCR collector regions 204 and first SCR well contact regions 205 to junction diode anode regions 207. The insulation layer 223 insulates the first metal 221 from the epitaxial layer 202 and the second metal 222. Vias 241 lined with conductive material connect the SCR portion and the junction diode portions of the first type of finger to the first metal 221. The vias may be created through the insulation layer 223 and lined with metals such as tungsten, titanium, aluminum or any combination thereof. The first metal 221 may connect each of the fingers of the first type in a direction orthogonal to the lateral stripes. The first metal 221 may also couple the fingers of the first type between different channels of the device. In some embodiments, to create a uni-directional device, the first metal 221 couples the fingers of the first type to ground. In other embodiments to create a bi-directional device the first metal 221 may be coupled a floating node which may be further coupled to another inverse device.

The fingers of the second type including an SCR portion and junction diode portion that form lateral stripes along a major surface of the epitaxial layer 202. The SCR portion of the fingers of the second type include an emitter region 213 and second well contact region 214 formed in the second well region 211. The SCR portions of the second finger type 211, 213, 214 are formed in the epitaxial layer 202 proximal to the SCR portions of the first finger type 203, 205, 206 and. Likewise, the junction cathode regions 215 are formed in the epitaxial layer proximal to the junction anode regions 207 Each junction anode region 207 is near a respective side of the SCR portions of the first finger type (203, 205, 206) that is perpendicular to the side proximal to the SCR portion of the second finger type (211, 213, 214). Similarly each junction cathode region 215 is near a respective side of the SCR portion of the second finger type (211, 213, 214) that is perpendicular to the side proximal to the SCR portion of the first finger type (203, 205, 206). A portion of the epitaxial layer 202 may separate the first well region 203 from the second well region 211. The SCR emitter regions 213 and SCR collector regions 205 are doped to from the surface of the epitaxial layer to a depth of around 0.2 to 0.5 microns in the respective second well region 211 and first well region 203. The first well regions 203 and second well regions 211 are doped from the surface of the epitaxial layer to around 1 to 1.5 microns.

A second metal layer 222 conductively couples the fingers of the second type in a channel and runs parallel to and orthogonal to the lateral direction of the doped stripes in the epitaxial layer. A third metal layer 212 may couple the SCR portion of the second finger type (211, 213, 214) to the Junction diode portion 215. The third metal layer 212 may be at the same height from the substrate as the first metal layer 221 and the third metal layer 212 may be formed at the same time as the first metal layer 221. The third metal layer 212 may be the same thickness as the first metal layer 221 and insulated from the first metal layer 221 by the insulation layer 223. The second metal layer 222 is electrically coupled to the SCR portion of the second type of finger and junction diode cathode region through vias 242 in the insulation layer 223. In some embodiments the vias 242 couple the SCR portion and junction diode portion of the second type of finger to the third metal and the third metal is coupled to the second metal through a third via 243 This creates connections between fingers of the second type over the first metal of the first finger type. The second metal layer 222 may run orthogonal to the parallel stripes of SCR portion and junction diode portions to couple multiple fingers of the second type and create a channel in a multi-channel device. Fingers of the second type may be interrupted in the epitaxial layer to allow the first metal to connect between fingers of the first type. The first and second metal layer may be created from any suitable conductive metal for example and without limitation, gold, silver, copper, tungsten, titanium, aluminum or any suitable alloy thereof. An I/O contact pad 231 may be coupled to the top surface of the second metal layer 222. The I/O contact pad 231 may be a redistribution layer (RDL) for the channel or a wire bond. The I/O contact pad may be made of any suitable metal for example and without limitation copper, aluminum, silver or gold. The I/O contact 231 pad may be formed over the epitaxial layer near the intersection between SCR portions and junction diode portions of the first type of fingers and the second type of fingers.

The insulation layer 223 may be coupled to the bottom of the second metal layer 222 and the first metal layer 221 may run underneath at least a portion of the second metal layer 222. The contact pad 231 may couple the fingers of the second type to a device to be protected from transients. It should be noted that the first metal layer 221 may be thinner than the second metal layer 222. The first metal 221 runs parallel to the lateral stripes in the epitaxial formed and orthogonal to the extent that the SCR portion and junction diode anode region 207 may be connected.

Figure 2B:
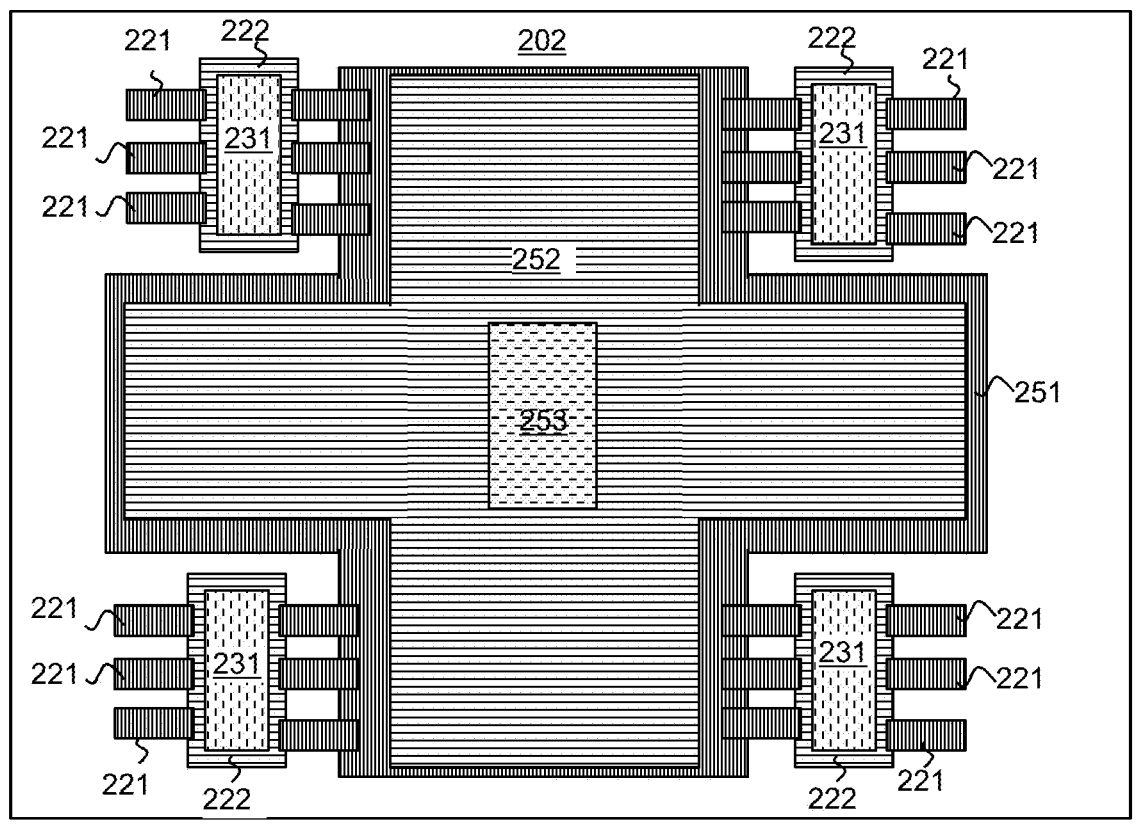
FIG. 2B depicts a top view of the improved multichannel bi-directional or uni-directional TVS device without the insulating layer according to aspects of the present disclosure.

FIG. 2B depicts a top view of the improved multichannel bi-directional or uni-directional TVS device without the insulating layer according to aspects of the present disclosure. The Multichannel TVS device shown includes five channels. Each channel includes a contact pad 231 coupled to the second conductive layer 222. The second metal layer 222 couples the second finger type and forms a channel for the TVS device. Each channel is isolated from the other channels in the multichannel TVS device. The first metal layer 221 runs underneath the second metal layer creating overlapping fingers as a portion of the second finger lies on either side of the first finger and the second metal runs over top the first metal. As shown, the first metal layer 221 runs in stripes laterally across the epitaxial layer paralleling the stripes of SCR portions and junction diode portions below the first metal. The second metal layer 222 runs orthogonally to the first metal and couples the finger of the second type. The first metal layer 221 may run laterally to an interconnect 251 which may couple the first metal layer 221 to a floating node or ground. The central contact pad 253 may be coupled to ground in which case the interconnect 251, second metal layer 252, and contact pad 253 would be conductively coupled. As shown, each of the first metal layers 221 in each of the channels is coupled by the interconnect 251 to the central ground 251 for a uni-directional device. In the case of a bi-directional device, the contact pad 253 may be coupled to another I/O channel of a device to be protected. Additionally, the second metal layer 252 may be coupled to the contact pad 253 and a plurality of the second fingers (not shown in this diagram). In the bi-directional TVS device interconnect 251 may act as the first metal layer and may couple a plurality first fingers that are each overlapped by a corresponding second finger creating an SCR and junction diode in the epitaxial layer as discussed with respect for FIG. 2A In the case of a uni-directional device, the second metal layer 252 may cover the interconnect 251 to improve conduction and reduce resistance.

Figure 3:
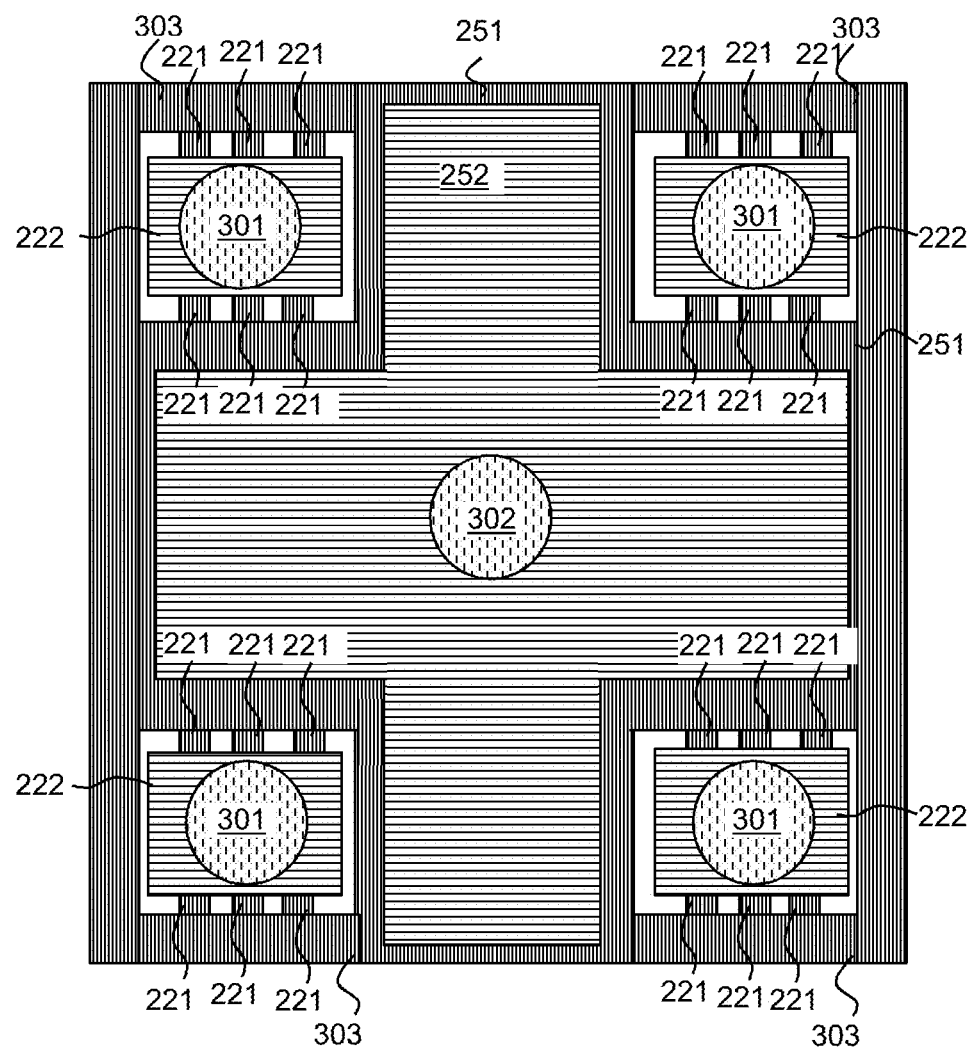
FIG. 3 shows another implementation of the improved multichannel bi-directional or uni-directional TVS device without the insulating layer according to aspects of the present disclosure.

FIG. 3 shows another implementation of the improved multichannel bi-directional or uni-directional TVS device without the insulating layer according to aspects of the present disclosure. In the implementation shown the I/O contact pads for each of the channels have been replaced with wire bonds 301 and the contact pad of the ground in a uni-directional device or a central channel for the multichannel device 302 has also been replaced with a wire bond. The wire bonds allow for cheaper manufacture. Additionally the device includes an interconnect 303 that run orthogonal to the direction of the lateral direction of the first and second type of fingers along the outer edge if the device. The interconnect 303 connects the edges of the first metal 221 metal layer to the other first metals layers 221 through the center first metal layer 251 which may also be a ground plane. In the case of a uni-directional device, the second metal layer 252 may cover the interconnect 251 to improve conduction and reduce resistance.

Figure 4:
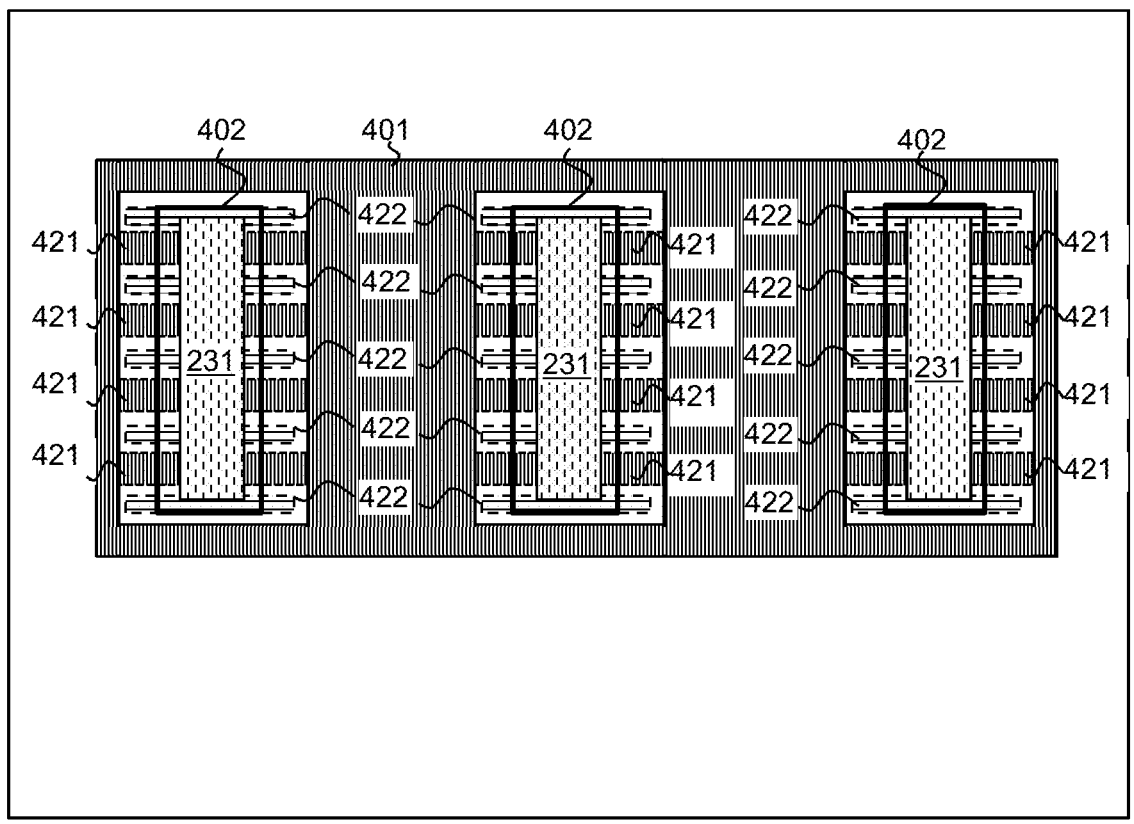
FIG. 4 shows a top down view of another implementation of the improved multichannel bi-directional or uni-directional TVS device without the insulating layer according to aspects of the present disclosure.

FIG. 4 shows a top down view of another implementation of the improved multichannel bi-directional or uni-directional TVS device without the insulating layer according to aspects of the present disclosure. In this implementation, the channels of the improved TVS device are arranged in a row. The first metal layer 421 of each of the channel may be connected via the interconnect 401. The interconnect 401 may also couple the first metal layer 421 of each of the first finger type to ground. The second metal layer 422 in this embodiment runs both parallel to the lateral stripes of the SCR portion and junction diode region and orthogonal 402 to the lateral stripes conductively coupling each of the fingers of the second type in the channel. The interconnect 401 allows current to flow between devices reducing resistance and consequently the clamping voltage. Additionally, the interconnect 401 may be covered with the second metal layer to reduce resistance.

Figure 5:
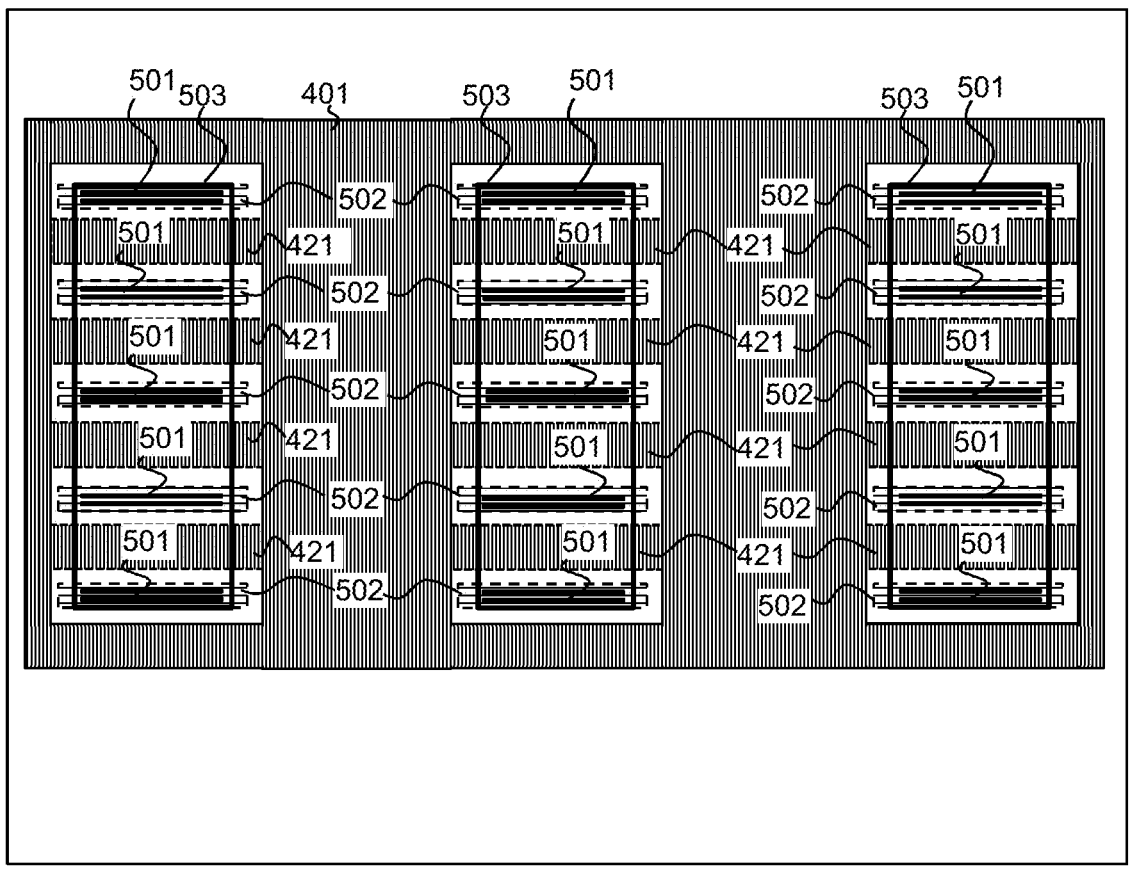
FIG. 5 depicts a top down view of the improved multi-channel bi-directional or unidirectional TVS device without the insulating and with a portion of the second metal layer outlined.

FIG. 5 depicts a top down view of the improved multichannel bi-directional or unidirectional TVS device without the insulating and with a portion of the second metal layer outlined. As shown vias 501 through the insulating layer connect the second type of fingers to the second metal layer 502, the second metal layer also runs orthogonal 503 to lateral stripes of the SCR portions and junction diode portions in the epitaxial layer to couple the second metal layer 502 of each finger. The first metal layer 421 extends across the device and are coupled together by the interconnect 401 which may be formed from the same metal as the first metal layer and runs orthogonal to the stripes of SCR portions and junction diode portions in the epitaxial layer to connect each of the first metal layers of the first finger type. Here, the second metal 503 creates a linear array of contacts that runs perpendicular to the fingers with the vias 501.

Figure 6:
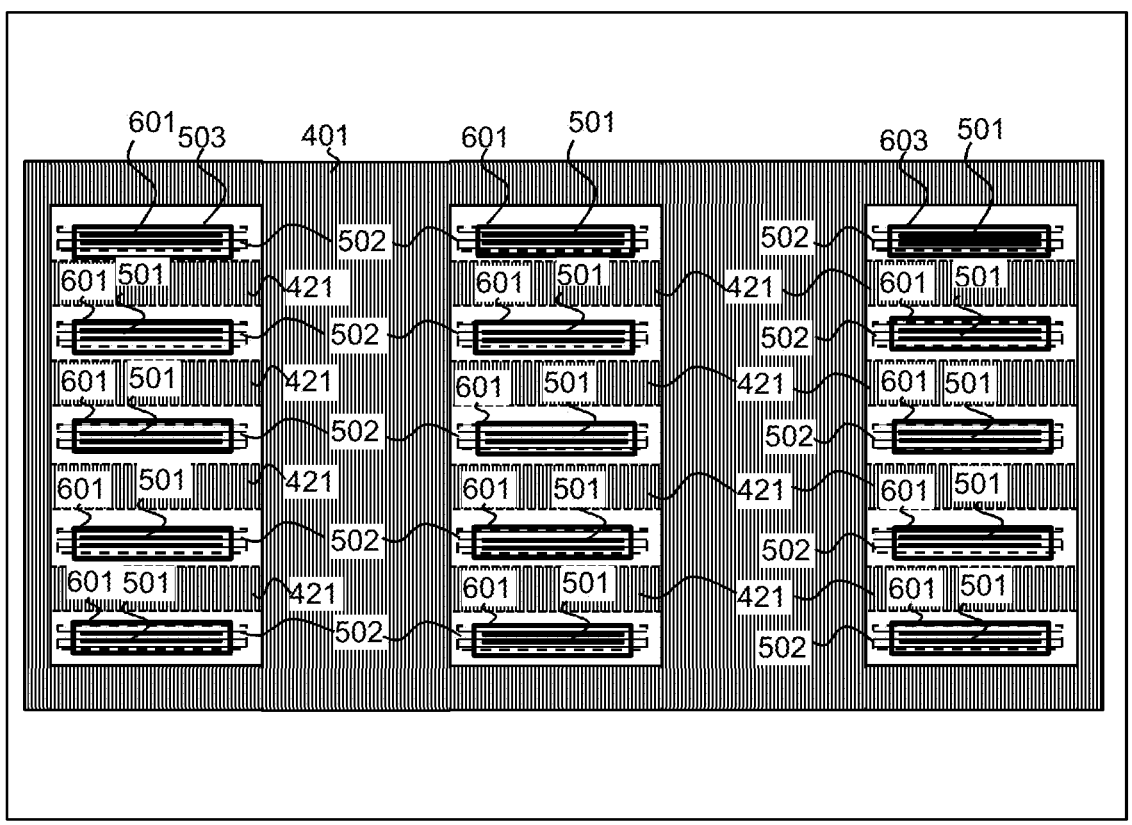
FIG. 6 shows a top down view of another implementation of the improved multichannel bi-directional or unidirectional TVS device without the insulating layer and with a portion of the second metal layer outlined.

FIG. 6 shows a top down view of another implementation of the improved multichannel bi-directional or unidirectional TVS device without the insulating layer and with a portion of the second metal layer outlined. In this implementation, the second metal 601 is interrupted over the first metal layer 221. Each second metal layer 601 includes a contact region wherein the second metal is interrupted over the first metal multiple contact regions are conductively coupled to form a single channel. This implementation reduces the capacitance in the first metal layer 221 by eliminating a portion of the second metal over the first metal layer.

FIG. 7A shows a cutaway side view of an alternative implementation improved a single channel of the TVS device according to aspects of the present disclosure. The improved multichannel TVS device may include a substrate 701 lightly doped with ions of the first conductivity type. An epitaxial layer 702 may be formed upon a major surface of the substrate 701 and the epitaxial layer 702 may be doped with relatively more ions of the first conductivity type than the substrate. The channel as shown includes three pairs of overlapping fingers with each of the second type of finger conductively coupled together with a second metal layer 722 that runs over top of; and is electrically isolated from a first metal layer 721. An I/O contact pad (not shown in FIG. 2A) may be coupled to the second metal layer 722 and conductively couple the fingers of the second type in one channel to a protected device. Each channel may comprise a plurality of overlapping fingers of the first and second arranged laterally on a major surface of the epitaxial layer 702. The first type of finger includes an SCR portion and junction diode portion. The SCR portion includes a well region 703 formed in the epitaxial layer and doped with ions of the first conductivity type. The SCR portion of the first finger type includes the cathode of the SCR created in the epitaxial layer 731. The first well region 703 is doped at depth of around 1-1.5 microns. The SCR portion also includes collector regions heavily doped with ions of the second conductivity type 705, and well contact regions 706. The collector region 705 and first SCR well contact region 706 create a SCR Cathode for the SCR formed in the epitaxial layer. The SCR collector region 705, may be doped at a depth of around 0.2-05 microns. The first finger type also includes a junction diode portion that may be the anode of a junction diode formed 732 formed in the epitaxial layer between the first and second overlapping fingers. As shown the junction portion of the first type of finger may include a junction anode region 707 formed in the epitaxial layer and heavily doped with ions of the first conductivity type. Both the SCR portion and the junction diode portion of the first finger are conductively coupled with a first metal layer 721 an insulating layer 723 electrically insulates the first metal layer from the epitaxial layer 702 and the second metal layer 722. Conductive material in vias through the insulating layer make contact with the anode region of the junction diode 707 and the heavily doped regions of opposite conductivity type 705, 706. The first metal layer 721 may conductively couple each of the fingers of the first type to ground for a unidirectional device or two a second channel for a bi-directional device.

The second finger type includes an SCR portion and a junction portion and includes a second metal layer over the first metal layer that is electrically isolated from the first metal layer. The SCR portion of the second type of finger includes a well region 711 doped with ions of the second conductivity type. The well region of the second type of finger is formed at a depth of 1-1.5 microns An SCR emitter region 714 is formed in the second well region 711 and a portion of the well region may create the second SCR well contact region 713. These regions act as the anode for the SCR formed in the epitaxial layer 731 between the SCR portions of the first and second type of fingers. The SCR emitter region heavily doped with ions of of the first conductivity types 714, 714 is formed in the well region at a depth of around 0.2-05 microns. The SCR emitter region 714 may include for example and without limitation, a region heavily doped with P-type ions 713 next to the second SCR contact region heavily doped with N-type ions 714 formed in the comparatively lighter doped N-type epitaxial layer 711. The doping concentration of the second SCR well contact region may be the same as the well region. The second type of finger includes a junction diode portion that acts as the cathode for the junction diode formed in the epitaxial layer 732. The junction diode cathode region 715 is a region of the epitaxial layer heavily doped with ions of the second conductivity type. The junction diode cathode region 715 is conductively coupled through vias in the insulating layer 723 to the second metal layer 722. The second metal layer 722 conductively couples the emitter and second well contact region of the SCR portions 713, 714 with the junction cathode region 715. The second metal layer 722 may also include a connection coupled to the top of the metal layer opposite the bottom of the metal, which may be in contact with the insulating layer 723. The contact pad (shown in FIG. 2) and the second metal layer 722 may couple the anode for the SCR and the cathode for the junction diode formed in the epitaxial layer to the I/O of the device to be protected from transients. The first and second metal layer may be created from any suitable conductive metal for example and without limitation, gold, silver, copper, tungsten, titanium, aluminum or any suitable alloy thereof.

Figure 7:
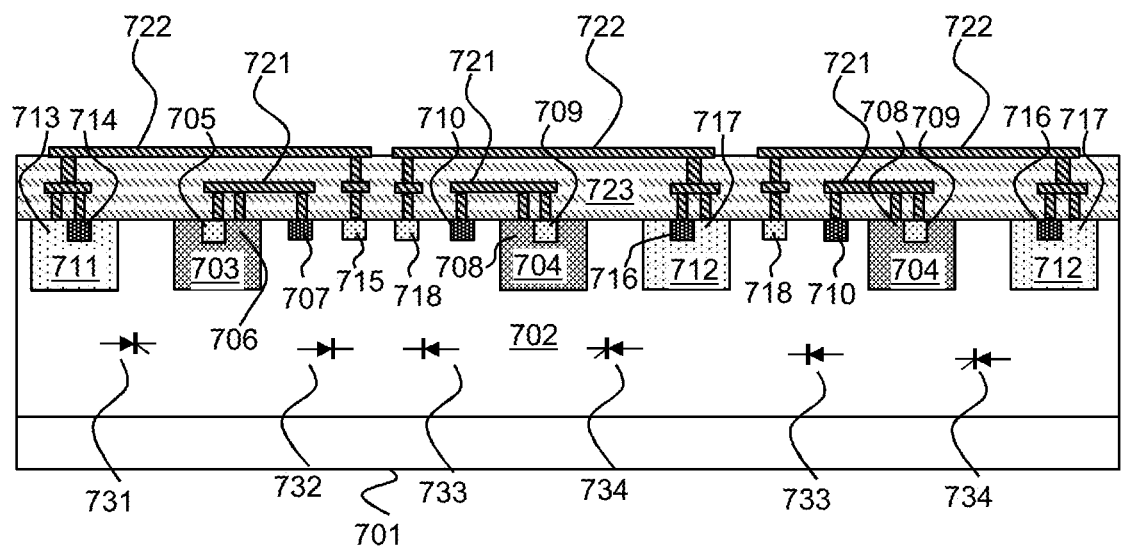
FIG. 7 shows a cut away side view of an alternative implementation of the improved a single channel of the TVS device according to aspects of the present disclosure.

Additionally, FIG. 7 depicts differing orientations of the fingers. As shown, the fingers may be in either a left or a right orientation. The left orientation has a first SCR portion with first SCR well region 703 and SCR collector region 705, and first SCR well contact region 706 located proximal to the left side of the substrate. Similarly, the second SCR portion with second SCR well region 711 and Second SCR well contact region 713, and SCR emitter region 714 are located proximal to the first SCR portion and the left side of the device. As shown, junction diode anode region 707 of the first finger type is located to closer to the right of the device and on the side of the first SCR well region 703 opposite the SCR portion of the second finger type 711, 713, 714. The junction diode cathode region for the second type finger 715 is located in the epitaxial layer proximal to a lateral side of the junction diode anode region 707 and on the side of the junction diode anode region 707 opposite to the SCR portion 703, 705, 706 of the first finger type. As shown in the right orientation the SCR portion 704, 708, 709 of the first finger type is located proximal to the right side of the device. The SCR portion of the second finger type 712, 716, 717 is also located proximal to the right side of the device and on the lateral side of the SRC portion of the first finger type opposite the junction diode anode region 710 for the first type of finger. Similarly, the junction diode cathode region 718 for the second finger type is located proximal to the junction diode anode region 710 for first finger type and near the lateral side of the junction diode anode region 710 opposite the SCR portion of the finger of the first type 704, 708, 709. While the orientation of these regions is mirrored, the operation remains the same between the left and right oriented fingers. Aspects of the present disclosure provide an improved TVS device having a more optimal configuration of interconnections between portions of the device. The improved device can have a lower capacitance and a more compact device package compared to conventional TVS devices due to the improved interconnection configuration. While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112, ¶6.

What is claimed is:

1. A transient voltage suppressing device, comprising:
an epitaxial layer on a surface of a substrate having a light concentration of ions of a first conductivity type wherein the first conductivity type is opposite a second conductivity type;
a plurality of fingers arranged laterally along a major surface of the epitaxial layer, the plurality of fingers comprising fingers of a first type and fingers of a second type, wherein the first type of finger and second type of finger each include a silicon controlled rectifier (SCR) portion and a junction diode portion, wherein the first type of finger includes a portion of a first metal layer that conductively couples the SCR portion to the junction diode portion, wherein the plurality of fingers of the second type are coupled together by a second metal layer electrically insulated from the first metal layer and disposed over top of the first metal layer, wherein a junction diode is formed between the junction diode portion of the first type of finger and the junction diode portion of the second type of finger; and wherein an SCR is formed between the SCR portion of the first type of finger and the SCR portion of the second type of finger wherein the fingers of the first type include a first well region lightly doped with ions of the first conductivity type formed in the epitaxial layer and a collector region heavily doped with ions of the second conductivity type formed in the first well region, wherein the first metal layer is conductively coupled to the collector region and connected by vias lined with conductive material to the first well region.

2. The transient voltage suppressing device of claim 1 further comprising an Input/Output (I/O) contact pad coupled to a top side of the second metal layer, wherein an insulation layer runs over top the first metal layer and the first metal layer is underneath the second metal layer.

3. The transient voltage suppressing device of claim 2 wherein the I/O contact pad is a wire bonded to the top side of the second metal layer.

4. The transient voltage suppressing device of claim 1 wherein the SCR portion of the first type of finger and the SCR portion of the second type of finger are located proximal to each other in the epitaxial layer and wherein a portion of the epitaxial layer separates the SCR portion of the first type of finger from the SCR portion of the second type of finger.

5. The transient voltage suppressing device of claim 1 wherein the junction diode portion of the first type of finger and the junction diode portion of the second type of finger are located proximal to each other in the epitaxial layer and wherein a portion of the epitaxial layer separates the junction diode portion of fingers of the first type from the junction diode portion of the fingers of the second type.

6. The transient voltage suppressing device of claim 1 wherein the first type of finger includes a SCR cathode region that acts as a cathode for the SCR formed between the SCR portion of the finger of the first type and fingers of the second type and wherein the second type of finger includes an SCR anode that acts an anode for the SCR.

7. The transient voltage suppressing device of claim 1 wherein the first type of finger includes a junction diode anode region that acts as an anode for the junction diode formed between the junction diode portion of the first type of finger and the junction diode portion of the second type of finger and wherein the second type of finger includes a junction diode cathode region that acts as a cathode for said junction diode.

8. The transient voltage suppressing device of claim 1 wherein the first type of fingers are electrically coupled to a reference node and the second type of fingers are electrically coupled to a protected node.

9. The transient voltage suppressing device of claim 1 wherein the fingers of the second type include a second well region lightly doped with ions of the second conductivity type formed in the epitaxial layer, and an emitter region heavily doped with ions of the first conductivity type formed in the second well region, wherein the second metal layer is conductively coupled to the second well region and the emitter region.

10. The transient voltage suppressing device of claim 1 wherein the junction diode portion of the first type of finger includes a junction diode anode region heavily doped with ions of the first conductivity type formed in the epitaxial layer.

11. The transient voltage suppressing device of claim 1 wherein the junction diode portion of the second type of finger includes a junction diode cathode region heavily doped with ions of the second conductivity type formed in the epitaxial layer.

12. The transient voltage suppressing device of claim 1 wherein the second metal layer is thicker than the first metal layer.

13. The transient voltage suppressing device of claim 1 wherein a third metal layer conductively couples the SCR portion and the junction diode portion of the second type of finger and wherein the third metal layer is conductively coupled to the second metal layer.

14. The transient voltage suppressing device of claim 13 wherein the third metal layer is at a same height from the epitaxial layer as the first metal layer and insulated from the first metal layer.

15. The transient voltage suppressing device of claim 14 wherein a first set of vias through an insulating layer conductively couple the third metal layer to the SCR portion and junction diode portion and a second set of vias through the insulating layer couple the third metal layer to the second metal layer.

16. The transient voltage suppressing device of claim 1 wherein the first metal layer is conductively coupled to a ground plane.

17. The transient voltage suppressing device of claim 1 wherein the SCR portion of the fingers of the first type includes a SCR collector region heavily doped with ions of the second conductivity type formed in a first well region of the epitaxial layer doped with ions of the first conductivity type and a first SCR well contact; and the SCR portion of the fingers of the second type include a SCR emitter region heavily doped with ions of the first conductivity type formed in a second well region of the epitaxial layer doped with ions of the second conductivity type and a second SCR well contact.

18. The transient voltage suppressing device of claim 17 wherein the SCR emitter region is located proximal to the SCR collector region.

19. The transient voltage suppressing device of claim 1 further comprising an insulating layer that insulates the first metal layer from the epitaxial layer and the second metal layer and wherein vias through the insulating layer electrically couple the first metal layer to the corresponding SRC portion and the junction diode portion and the second metal layer to the corresponding SCR portion and the junction diode portion.

* * * * *